(12) United States Patent
Evans et al.

(10) Patent No.: US 8,773,927 B2
(45) Date of Patent: Jul. 8, 2014

(54) ADJUSTING BIT-LINE DISCHARGE TIME IN MEMORY ARRAYS BASED ON CHARACTERIZED WORD-LINE DELAY AND GATE DELAY

(75) Inventors: Donald Albert Evans, Carroll, OH (US); Rasoju Veerabadra Chary, Karnataka (IN); Richard John Stephani, Saint Paul, MN (US); Bijan Kumar Ghosh, Karnataka (IN); Ronald Brian Steele, Northampton, PA (US)

(73) Assignee: LSI Corporation, San Jose, CA (US)

( * ) Notice: Subject to any disclaimer, the term of this patent is extended or adjusted under 35 U.S.C. 154(b) by 11 days.

(21) Appl. No.: 13/606,342

(22) Filed: Sep. 7, 2012

(65) Prior Publication Data

US 2014/0071775 A1    Mar. 13, 2014

(51) Int. Cl.
*G11C 7/00* (2006.01)
*G11C 7/22* (2006.01)

(52) U.S. Cl.
CPC . *G11C 7/00* (2013.01); *G11C 7/222* (2013.01)
USPC ............ 365/194; 326/33; 713/600; 716/56

(58) Field of Classification Search
CPC ............ G11C 7/00; G11C 7/222; G11C 8/18
USPC ........................................................ 365/194
See application file for complete search history.

(56) References Cited

U.S. PATENT DOCUMENTS

| | | | |
|---|---|---|---|
| 4,223,396 A | 9/1980 | Kinoshita | |
| 4,460,980 A | 7/1984 | Hagiwara et al. | |
| 5,221,867 A | 6/1993 | Mitra et al. | |
| 5,414,663 A | 5/1995 | Komarek et al. | |
| 5,581,203 A | 12/1996 | Komarek et al. | |
| 5,650,979 A | 7/1997 | Komarek et al. | |
| 5,793,698 A | 8/1998 | Komarek et al. | |
| 5,886,929 A | 3/1999 | Becker et al. | |
| 5,907,517 A | 5/1999 | Komarek et al. | |
| 5,936,905 A | 8/1999 | Proebsting | |
| 6,292,015 B1 | 9/2001 | Ooishi et al. | |
| 6,947,339 B2 | 9/2005 | Lee et al. | |

(Continued)

FOREIGN PATENT DOCUMENTS

WO    WO9605655 A1    2/1996
WO    WO2009114286 A1    9/2009

*Primary Examiner* — Hoai V Ho
*Assistant Examiner* — Muhammad Islam
(74) *Attorney, Agent, or Firm* — Mendelsohn, Drucker & Dunleavy, P.C.; Craig M. Brown; Steve Mendelsohn

(57) ABSTRACT

A memory tracking circuit controls discharge duration of a tracking bit-line based on (i) a signal received at the far end of a tracking row after a propagation delay and (ii) a signal applied to a transistor-based gate delay. The tracking circuit (i) extends the discharge duration when one or more of (a) the propagation delay and (b) the transistor-based gate delay is shorter than an uncontrolled discharge duration of the tracking bit-line, and (ii) does not extend the discharge duration otherwise. Based on the discharge duration, the tracking circuit activates a reset signal that resets a clock-pulse generator to switch the memory from an access operation to a recess state. Controlling the discharge duration, and consequently the reset signal, based on the propagation delay and the gate delay allows the clock-pulse generator to adjust access times to account for the memory array configuration and process, temperature, and voltage conditions.

16 Claims, 13 Drawing Sheets

(56) References Cited

U.S. PATENT DOCUMENTS

| | | |
|---|---|---|
| 7,111,185 B2 | 9/2006 | Gomm et al. |
| 7,859,920 B2 * | 12/2010 | Jung et al. ............... 365/189.15 |
| 7,882,407 B2 | 2/2011 | Abu-Rahma et al. |
| 2001/0052792 A1 | 12/2001 | Ooishi et al. |
| 2003/0038653 A1 | 2/2003 | Ooishi et al. |
| 2004/0246812 A1 | 12/2004 | Bhavnagarwala et al. |
| 2006/0265622 A1 | 11/2006 | Gomm et al. |
| 2008/0028255 A1 * | 1/2008 | Dawson et al. ............... 713/600 |
| 2013/0155758 A1 * | 6/2013 | Liu et al. ....................... 365/154 |

* cited by examiner

ADJUSTING BIT-LINE DISCHARGE TIME IN MEMORY ARRAYS BASED ON CHARACTERIZED WORD-LINE DELAY AND GATE DELAY

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Embodiments of disclosure will become more fully apparent from the following description, the appended claims, and the accompanying drawings in which like reference numerals identify similar or identical elements. In the accompanying drawings:

Figure 1:
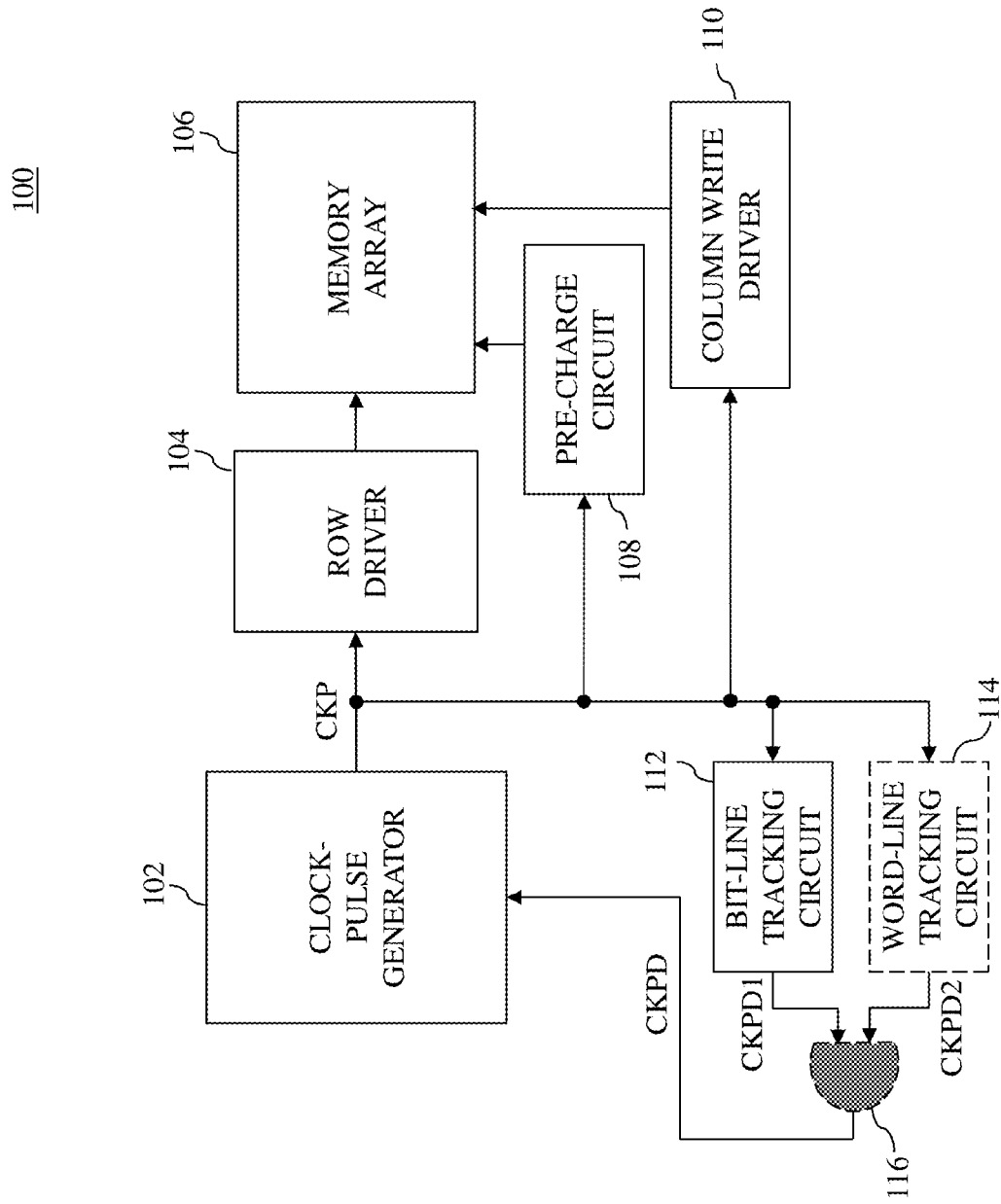
FIG. 1 shows a simplified block diagram of a memory device according to one embodiment of the disclosure.

Referring to FIG. 1, a simplified block diagram is shown of a memory device 100 according to one embodiment of the disclosure. Memory device 100 has a memory array 106, which may be implemented using relatively high-speed memory technologies such as static random-access memory (SRAM), content addressable memory (CAM), and register files. Memory array 106 stores bits of information in an array of memory cells, where the cells are arranged in one or more columns and one or more rows. Each cell comprises a plurality of storage transistors configured to store a value (i.e., one or more bits) and a plurality of access transistors configured to enable accessing (i.e., reading from and/or writing to) the cell. For example, according to one embodiment of the disclosure, memory array 106 is implemented using SRAM, where each cell stores one bit of information using four storage transistors configured to form two cross-coupled inverters, where the cell is accessed using two access transistors.

In general, access to the cells in a row of memory array 106 is controlled by a word line, which controls the state of the access transistors of each cell in that row. When conditions are being established to access (i.e., execute a read or write operation for) a row of memory array 106, clock-pulse generator 102 changes the state of a clock-pulse signal CKP by asserting the clock-pulse signal CKP to switch from a logic low state to a logic high state. Based on the state of the clock-pulse signal CKP, a row driver 104 for the corresponding row generates a word-line pulse that drives the word line of that row of memory array 106 such that the access transistors connect each cell in the row to one or more bit lines for either (i) reading a value stored in the cell or (ii) writing a value to the cell.

Note that, as used herein, the terms "assert", "asserts", "asserted", and "is asserted" refer to signals whose voltages are driven high, and the terms "de-assert", "de-asserts", "de-asserted" and "is de-asserted" refer to signals whose voltages are driven low. It will be understood that, in alternative (e.g., logic low) implementations, these definitions would be reversed.

Suppose for this discussion that two bit lines are implemented for each column of memory array 106: a true bit line and a corresponding complement bit line. Prior to executing either a read or write operation for a memory cell (i.e., when the clock-pulse signal CKP is de-asserted), pre-charge circuit 108 pre-charges both bit lines of the memory cell to a logic high state by connecting the bit lines to a pre-charge voltage source. Pre-charge circuit 108 is controlled based on the clock-pulse signal CKP, although there may be further circuitry (not shown) between clock-pulse generator 102 and pre-charge circuit 108, such as address decoding circuitry and buffers.

In order to execute a read operation, the clock-pulse signal CKP is asserted to connect the word line corresponding to the memory cell to the memory cell's bit lines. Based on the asserted clock-pulse signal CKP, pre-charge circuit 108 disconnects the bit lines from the pre-charge voltage source, and either the true bit line or its complement is discharged through the memory cell, depending on whether the value stored by the cell is a zero or a one. A sense amplifier (not shown) detects the difference in voltage between the two bit lines and determines whether a zero or a one is stored in the memory cell based on the detected voltage difference.

For a write operation, the clock-pulse signal CKP is asserted, and pre-charge circuit 108 disconnects the memory cell's bit lines from the pre-charge voltage source. However, rather than discharging either the true bit line or its complement through the memory cell, a corresponding column write driver 110 discharges either the true bit line or its complement, depending on whether the value to be stored by the memory cell is a zero or a one. The word line connects the memory cell to the bit lines so that the value to be stored, represented as a voltage difference, is latched in. Once a read or write operation is complete, the clock-pulse signal CKP is de-asserted, thereby disconnecting the memory cell's bit lines and causing pre-charge circuit 108 to return the bit lines to the pre-charged state by reconnecting the bit lines to the pre-charge voltage source.

The width and height of the clock-pulse signal CKP, defining a duration of time and either a logic high state or a logic low state, are critical to the proper operation of the bit lines of memory array 106. On the one hand, if the pulse is not of sufficient time duration and appropriate state (i.e., analog voltage level) to allow the true bit line or its complement to sufficiently discharge before being returned to a pre-charge state, then the voltage difference between the two bit lines might not be large enough for (i) the sense amplifier to successfully detect whether the value being read is a zero or a one or (ii) the memory cell to successfully store the value being written. On the other hand, if the pulse duration is greater than needed to sufficiently discharge the true bit line or its complement, then the bit lines will be inhibited from returning to their pre-charge state and the performance of device 100 will be unnecessarily slowed.

To ensure proper functionality of the bit lines, memory device 100 has bit-line tracking circuit 112. Bit-line tracking circuit 112, one embodiment of which is discussed in further detail below in relation to FIGS. 2-6, is configured with dummy memory elements such as one or more dummy columns (also known as tracking columns or tracking bit lines) that are used as a reference for the timing characteristics of the bit lines of memory array 106. For instance, a tracking column may be used to characterize how much time is required to discharge a bit line of a column of memory array 106 such that a read or write operation may be executed successfully. Each memory column is assumed to have the same timing characteristics as the tracking column.

In general, bit-line tracking circuit 112 (i) receives the clock-pulse signal CKP and (ii) controls the state of a reset signal CKPD1 that is provided to clock-pulse generator 102 or, in some embodiments, to AND gate 116 as discussed below. When clock-pulse generator 102 asserts clock-pulse signal CKP to initiate an access operation (i.e., execute a read and/or write operation), the reset signal CKPD1 is initially in a low state (i.e., de-asserted). Bit-line tracking circuit 112 determines when to assert the reset signal CKPD1 based on the timing characteristics of the tracking column as discussed in further detail below. As long as reset signal CKPD1 is de-asserted, clock-pulse generator 102 is inhibited from (i) terminating the access operation and (ii) placing memory array 106 back into a recess state. As used herein, the term "recess state" refers to a state where memory array 106 is not being accessed. The length of time between assertion of the clock-pulse signal CKP and assertion of the reset signal CKPD1 is selected by bit-line tracking circuit 112 to have minimal, if any, adverse impact on (i) the functionality of the cells in each row and (ii) the speed of the memory.

The width and height of the clock-pulse signal CKP, defining a time duration and a logic high state or a logic low state, are also critical to the proper operation of the word lines of memory array 106. Specifically, the amount of time that the clock pulse CKP is asserted affects the proper operation of the access transistors in each row of memory array 106. On the one hand, if the pulse is not of sufficient time duration and appropriate state to allow access transistors at the far end of the word line to reach and maintain the threshold voltage level of the access transistors before the pulse reverts to its initial state, then the access transistors in one or more cells at the far end of the row will not activate. As a result, bits of information cannot be reliably written to or read from those cells. On the other hand, if the pulse duration is greater than needed to write data to and/or read data from cells at the far end of the word line, then the performance of memory device 100 will be unnecessarily slow. Note that, for this specification, word lines and bit lines are described as being driven from one end toward the other. However, it is understood that word lines and bit lines can be driven from other locations, such as from the center toward two opposing ends.

To further ensure suitable functionality of the cells and speed of memory device 100, some embodiments of the disclosure further comprise a word-line tracking circuit 114 to control the termination of read and/or write operations. The dashed boxes indicate that word-line tracking circuit 114 and AND gate 116 are optional features of memory device 100. Word-line tracking circuit 114, one embodiment of which is described in further detail below in relation to FIGS. 9-12, is configured with one or more dummy rows (also known as tracking rows or tracking word lines) that are used as a reference for the timing characteristics of the word lines of memory array 106. For instance, a tracking row may be used to characterize how much time is required for the far end of a word line of a tracking row of memory array 106 to reach the threshold voltage [magnitude] level of the access transistors to activate the access transistors after a word-line pulse is applied to a near end of the row. Each memory row is assumed to have the same timing characteristics as the tracking row. Note that memory devices may have multiple memory arrays, and each memory array may have its own one or more tracking rows and one or more tracking columns.

In general, when implemented, word-line tracking circuit 114 receives the clock-pulse signal CKP, and controls the state of a reset signal CKPD2 that is provided to AND gate 116. When clock-pulse generator 102 asserts clock-pulse signal CKP to initiate an access operation, the reset signal CKPD2 is initially de-asserted. Word-line tracking circuit 114 determines when to assert the reset signal CKPD2 based on the timing characteristics of the tracking row and a gate delay (discussed in further detail below). As long as reset signal CKPD2 is de-asserted, clock-pulse generator 102 is inhibited from terminating the access operation and placing memory array 106 back into a recess state. The length of time between assertion of the clock-pulse signal and assertion of the reset signal CKPD2 is selected by word-line tracking circuit 114 to have minimal, if any, adverse impact on (i) the functionality of the cells in each row and (ii) the speed of the memory.

Although not shown, some embodiments of memory device 100 may have even yet further tracking circuitry. The outputs of tracking circuit 112, tracking circuit 114, and any other tracking circuits may be applied to AND gate 116, which applies logical conjunction to the outputs to generate a reset signal CKPD that clock-pulse generator 102 uses to reset the clock-pulse signal CKP. In such embodiments, clock-pulse generator 102 is inhibited from de-asserting clock-pulse signal CKP to terminate the access operation and place memory array 106 back into a recess state as long as at least one of the output signals (e.g., reset signal CKPD1 or reset signal CKPD2 or both) is de-asserted.

The speed of integrated circuitry, and consequently, the duration of the clock-pulse signal CKP, tend to vary with variations in process, voltage, and temperature (PVT). In fast PVT conditions, the collective gate delays of the circuitry used to implement memory device 100 shorten. As used herein, the term "collective gate delay" refers to the sum of a plurality of individual gate delays corresponding to a plurality of transistors connected in series. Further, the term "individual gate delay" refers to the delay between (i) the time that an input to a logic gate of a transistor transitions to a different state and (ii) the time that the output of the logic gate transitions to a different state. As a result of these shortened collective gate delays in fast PVT conditions, the duration of the clock-pulse signal CKP would shrink without the use of one or more of bit-line tracking circuit 112 and word-line tracking circuit 114. As a result of the shrinking of clock-pulse signal CKP, the amount of time that the bit-lines are discharged and the amount of time that the cells are connected by the word lines would shrink, possibly inhibiting the proper operation of some or all of the memory cells in memory array 106.

The size of memory array 106 may also adversely affect the proper operation of some or all of the memory cells in memory array 106 without the use of one or more of bit-line tracking circuit 112 and word-line tracking circuit 114. For example, suppose that the number of rows of memory array 106 is larger than the number of columns, such that memory array 106 is tall yet narrow. In such an embodiment, the word line being accessed could time out before the true bit line or its complement has had sufficient time to discharge.

Bit-line tracking circuit 112 and word-line tracking circuit 114 balance the competing needs of ensuring reliable reading and/or writing, while at the same time, ensuring sufficient chip speed. Bit-line tracking circuit 112 (i) extends the bit-line discharge duration when memory device 100 is in a fast PVT condition and/or has a tall and narrow array configuration to ensure that the true bit line or its complement is sufficiently discharged and (ii) does not extend the bit-line discharge duration when memory device 100 is in a slow PVT condition and does not have a tall and narrow array configuration to prevent discharge times from growing unnecessarily long. Word-line tracking circuit 114 (i) extends the amount of time that the cells are connected by the word lines for fast PVT conditions thereby ensuring reliable reading and/or writing, and (ii) does not extend the amount of time that the cells are connected by the word lines for slow PVT conditions to prevent access times from growing unnecessarily long.

Figure 2:
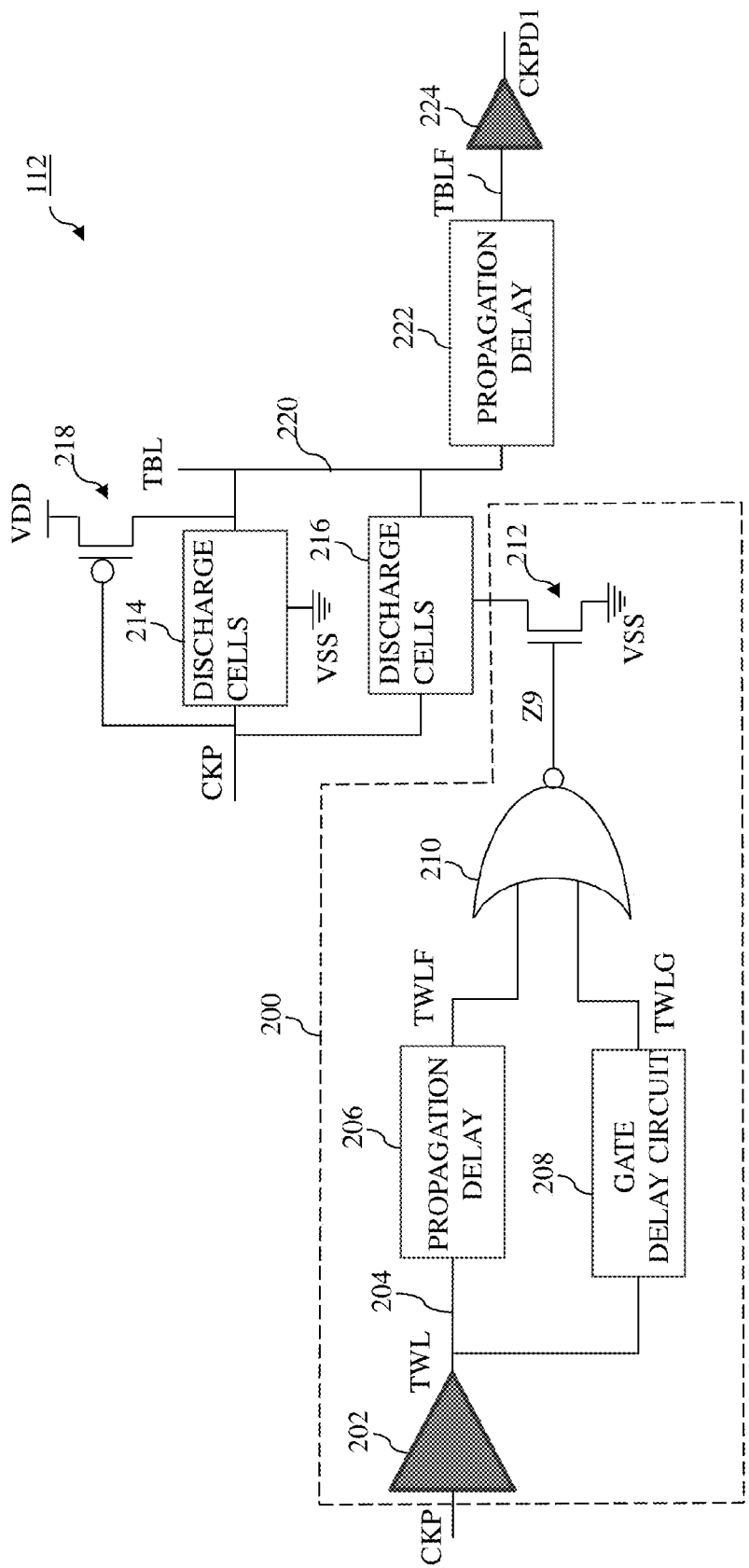
FIG. 2 shows a schematic diagram of the bit-line tracking circuit of FIG. 1 according to one embodiment of the disclosure.

FIG. 2 shows a schematic diagram of bit-line tracking circuit 112 of FIG. 1 according to one embodiment of the disclosure. Bit-line tracking circuit 112 comprises a tracking bit-line 220 that is pre-charged using a p-type field-effect transistor (PFET) 218 and a logic-high pre-charge voltage source VDD. In particular, when the clock-pulse signal CKP is de-asserted, PFET 218 is turned on, and the signal TBL at the near end of the tracking bit-line 220 is pre-charged to a logic-high state. After a propagation delay 222 across tracking bit-line 220 caused by, for example, the resistive-capacitive (RC) characteristics of tracking bit-line 220, the signal TBLF at the far end of tracking bit-line 220 is asserted. Note that propagation delay 222 does not represent a discrete delay element but rather represents the delay properties of tracking bit-line 220. Inverter 224 inverts the signal TBLF at the far end of tracking bit-line 220 to de-assert reset signal CKPD1.

When the clock-pulse signal CKP is asserted, indicating the execution of a read or write operation, PFET 218 turns off such that tracking bit-line 220 is disconnected from the pre-charge voltage source VDD and allowed to discharge. Discharge of tracking bit-line 220 is facilitated by a first set 214 of one or more discharge cells and a second set 216 of one or more discharge cells. Each discharge cell in each of the first and second sets may be a memory cell, a switch, or any other suitable component or suitable combination of components capable of discharging tracking bit-line 220.

Initially, when a read or a write operation is initiated, the asserted clock-pulse signal CKP turns on first set 214 such that tracking bit-line 220 is permitted to discharge through first set 214 to ground. Additionally, the asserted clock-pulse signal CKP turns on second set 216 and signal Z9 is asserted to turn on n-type field-effect transistor (NFET) 212 of discharge control circuit 200 such that tracking bit-line 220 is permitted to also discharge through second set 216 to ground.

At some point during the discharge of tracking bit-line 220, discharge control circuit 200 may turn off NFET 212 such that tracking bit-line 220 is no longer connected to ground through second set 216. Discharge control circuit 200 controls the operation of NFET 212 based on (i) a propagation delay 206 across a tracking word-line 204 and (ii) a transistor-based gate delay introduced by gate-delay circuit 208. The tracking word-line propagation delay 206 is a delay in time that begins when a word-line pulse TWL, generated in response to the application of the clock-pulse signal CKP to a tracking-row driver 202, is applied to the near end of tracking word-line 204 and ends when the delayed word-line pulse TWLF reaches the far end of tracking word-line 204. The tracking word-line propagation delay 206 is caused by the resistive-capacitive (RC) characteristics of tracking word-line 204. Note that propagation delay 206 does not represent a discrete delay element but rather represents the delay properties of tracking word-line 204.

The transistor-based gate delay is a delay caused by applying the word-line pulse TWL at the near end of tracking word-line 204 to tracking-gate circuit 208, which comprises one or more series-connected gate-delay devices (e.g., transistors and/or inverters) that generate an individual transistor-based gate delay (when circuit 208 has only one gate-delay device) or a collective transistor-based gate delay (when circuit 208 has more than one gate-delay device). The RC-delayed signal TWLF and the gate-delayed signal TWLG are applied to a NOR gate 210, which de-asserts signal Z9, thereby turning off NFET 212, when either the RC-delayed signal TWLF or the gate-delayed signal TWLG is asserted.

In general, when clock-pulse signal CKP is asserted, a race begins between (i) both the RC-delayed signal TWLF and the gate-delayed signal TWLG and (ii) the discharge duration of tracking bit-line 220. This race determines how long tracking bit-line 220 will be discharged, consequently, when bit-line tracking circuit 112 will assert reset signal CKPD1 to reset clock-pulse generator 102. If either or both of the RC-delayed signal TWLF and the gate-delayed signal TWLG are asserted before discharge of the tracking bit-line 220 is complete, then the discharge rate is slowed to extend the time that the reset signal CKPD1 is de-asserted. If neither the RC-delayed signal TWLF nor the gate-delayed signal TWLG is asserted before discharge of the tracking bit-line 220 is complete, then the discharge rate, and consequently, the time that the reset signal CKPD1 is de-asserted, is unmodified.

When the race begins, one of four scenarios may occur. In the first scenario, the tracking word-line propagation delay 206 is shorter than the discharge duration of tracking bit-line 220, which is shorter than the transistor-based gate delay caused by gate-delay circuit 208. In such a case, memory array 106 typically has a tall and narrow configuration and memory device 100 is typically in a slow PVT condition. As a result, the RC-delayed signal TWLF causes NOR gate 210 to de-assert signal Z9, thereby turning off NFET 212 before tracking bit-line 220 fully discharges to slow the rate at which tracking bit-line 220 is discharged.

In the second scenario, the transistor-based gate delay caused by gate-delay circuit 208 is shorter than the discharge duration of tracking bit-line 220, which is shorter than the tracking-word-line propagation delay. In such a case, memory array 106 typically does not have a tall and narrow configuration and memory device 100 is typically in a fast PVT condition. As a result, the gate-delayed signal TWLG causes NOR gate 210 to de-assert signal Z9, thereby turning off NFET 212 before tracking bit-line 220 fully discharges to slow the rate at which tracking bit-line 220 is discharged.

In the third scenario, the tracking-word-line propagation delay 206 is shorter than, equal to, or longer than the transistor-based gate delay caused by gate-delay circuit 208. However, both the tracking-word-line propagation delay 206 and the transistor-based gate delay are shorter than the discharge duration of tracking bit-line 220. In such a case, memory array 106 typically has a tall and narrow configuration and memory device 100 is typically in a fast PVT condition. As a result, the RC-delayed signal TWLF, the gate-delayed signal TWLG, or both the RC-delayed signal TWLF and the gate-delayed signal TWLG causes NOR gate 210 to de-assert signal Z9, thereby turning off NFET 212 before tracking bit-line 220 fully discharges to slow the rate at which tracking bit-line 220 is discharged.

In the fourth scenario, both the tracking-word-line propagation delay 206 and the transistor-based gate delay are longer than the discharge duration of tracking bit-line 220. In such a case, memory array 106 typically does not have a tall and narrow configuration and memory device 100 is typically in a slow PVT condition. As a result, neither the RC-delayed signal TWLF nor the gate-delayed signal TWLG causes NOR gate 210 to de-assert signal Z9 before tracking bit-line 220 fully discharges. Thus, NFET 212 turns off after tracking bit-line 220 fully discharges and the rate at which tracking bit-line 220 is discharged is unaffected. To further understand these four scenarios, consider FIGS. 3-6.

Figure 3:
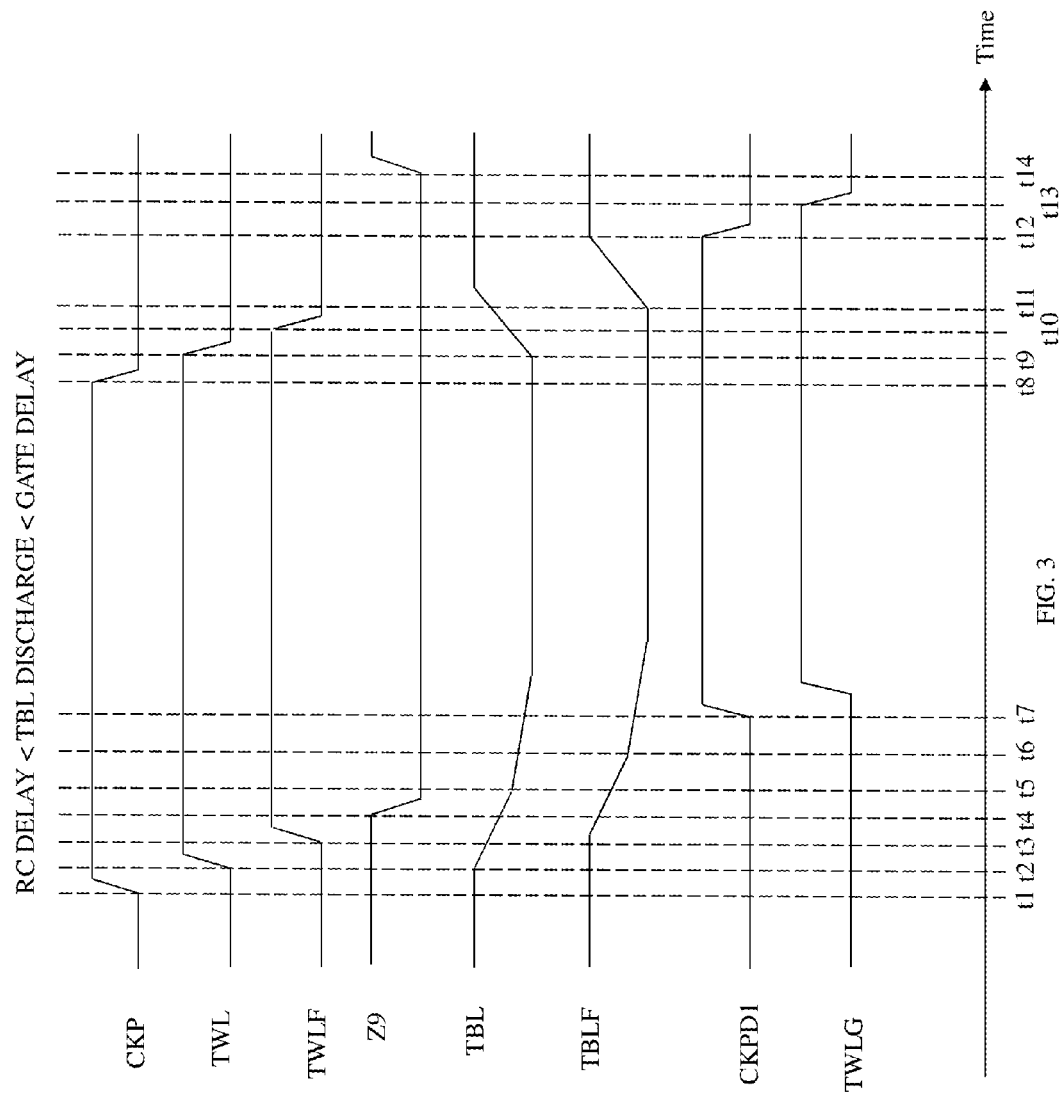
FIG. 3 shows a timing diagram for the bit-line tracking circuit of FIG. 2 for the first scenario when the tracking word-line propagation delay is shorter than the discharge duration of tracking bit-line, which is shorter than the transistor-based gate delay caused by the gate-delay circuit.

FIG. 3 shows a timing diagram for bit-line tracking circuit 112 of FIG. 2 for the first scenario when the tracking word-line propagation delay 206 is shorter than the discharge duration of tracking bit-line 220, which is shorter than the transistor-based gate delay caused by gate-delay circuit 208. As shown, at time t1, the clock-pulse generator asserts the clock-pulse signal CKP such that PFET 218 turns off and the first and second sets 214 and 216 of discharge cells connect tracking bit-line 220 to ground. As a result, the signal TBL at the near end of tracking bit-line 220 begins to discharge at time t2, and the signal TBLF at the far end of tracking bit-line 220 begins to discharge between time t3 and t4 after tracking-bit-line propagation delay 222.

Also at time t2, tracking-row driver 202 asserts the signal TWL at the near end of tracking word-line 204 based on the asserted clock-pulse signal CKP. After a propagation delay, the RC-delayed signal TWLF asserts at time t3, causing NOR gate 210 to de-assert signal Z9 at time t4. In response to the de-asserted signal Z9, NFET 212 turns off at time t5, and the discharge rate of tracking bit-line 220 is slowed as indicated by the change of the slope of the signal TBL at the near end of tracking bit-line 220 at time t5. This slowing of the discharge rate is reflected in the signal TBLF at the far end of tracking bit-line 220 at time t6 after tracking-bit-line propagation delay 222.

At time t7, the voltage level of the signal TBLF at the far-end of tracking bit-line 220 is sufficiently low that inverter 224 asserts the reset signal CKPD1. Between time t7 and time t8, the gate-delayed signal TWLG is asserted and NOR gate 210 continues to de-assert signal Z9. Since NFET 212 is already turned off by the de-asserted signal Z9 at time t5, the gate-delayed signal TWLG has no additional effect on the discharge rate of tracking bit-line 220.

Between time t7 and time t8, there is a brief delay where the asserted reset signal CKPD1 travels back and resets the clock-pulse generator. This delay could be due, in part, to a delay by other tracking circuits such as word-line tracking circuit 114 of FIG. 1 in indicating to the clock-pulse generator that it is okay to reset the clock-pulse signal CKP. Upon being reset, the clock-pulse signal CKP is de-asserted at time t8, placing the memory back into a recess state and pre-charging tracking bit-line 220.

From time t9 to time t14, signals TBL, TBLF, TWL, TWLF, TWLFC, Z9, and CKPD1 in bit-line tracking circuit 112 return to their initial states prior to time t1. In particular, the de-asserted clock-pulse signal CKP causes PFET 218 to turn on such that the signal TBL at the near end of tracking bit-line 220 is asserted at time t9 and the signal TBLF at the far end of tracking bit-line 220 is asserted at time tn. In response to the asserted signal TBLF at the far end of tracking bit-line 220, the reset signal CKPD1 is de-asserted at time t12.

The de-asserted clock pulse signal CKP also causes tracking row driver 202 to de-assert signal TWL at time t9, which in turn de-asserts RC-delayed signal TWLF at time t10 and gate-delayed signal TWLG at time t13. The de-asserted RC-delayed signal TWLF and gate-delayed signal TWLG cause NOR gate 210 to assert signal Z9 at time t14.

Figure 4:
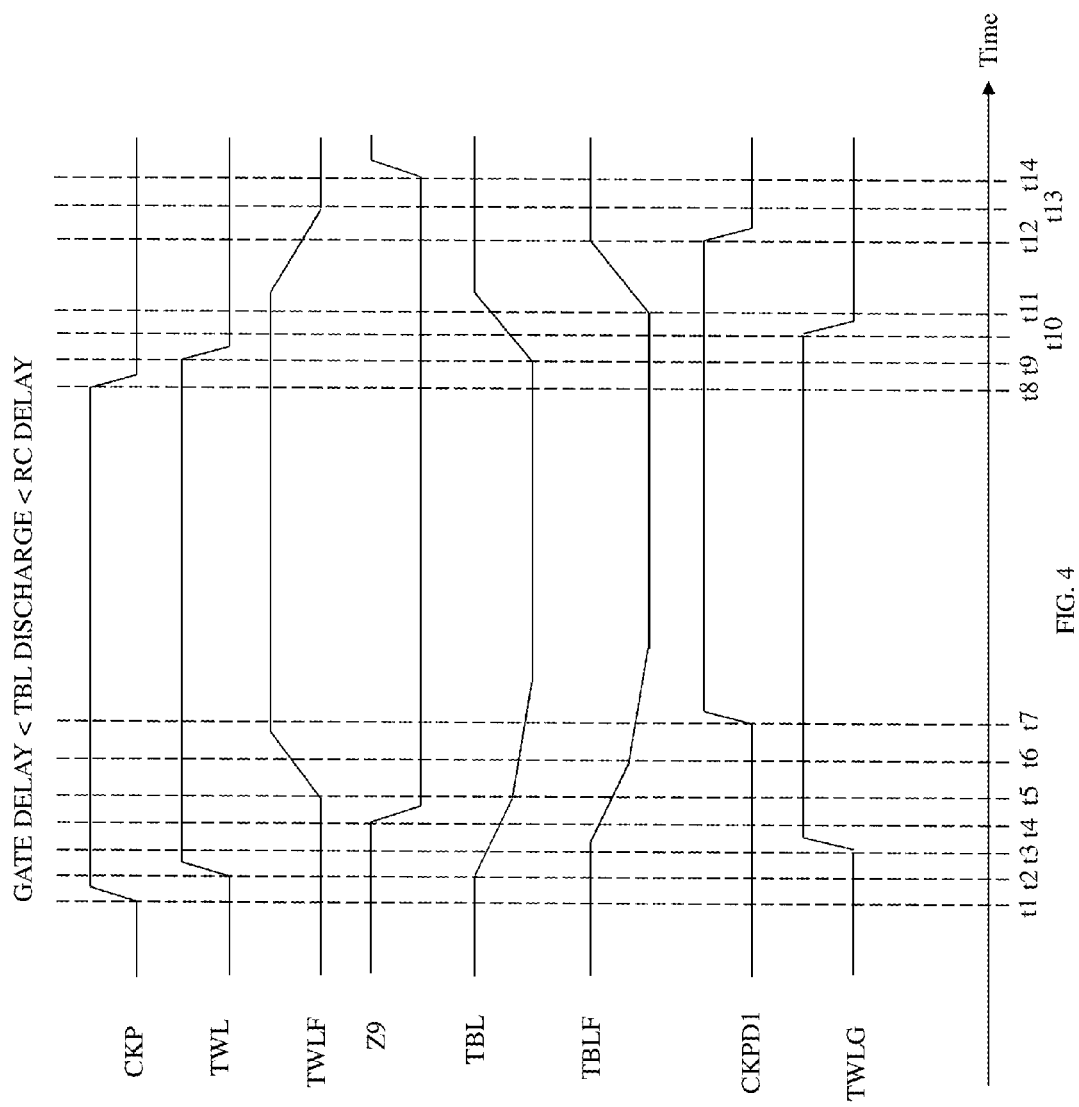
FIG. 4 shows a timing diagram for the bit-line tracking circuit of FIG. 2 for the second scenario when the transistor-based gate delay caused by the gate-delay circuit is shorter than the discharge duration of the tracking bit-line, which is shorter than the tracking-word-line propagation delay.

FIG. 4 shows a timing diagram for bit-line tracking circuit 112 of FIG. 2 for the second scenario when the transistor-based gate delay caused by gate-delay circuit 208 is shorter than the discharge duration of tracking bit-line 220, which is shorter than the tracking-word-line propagation delay. Prior to time t3, bit-line tracking circuit 112 operates in the same manner as it does in the first scenario described above. However, at time t3, the gate-delayed signal TWLG is asserted, rather than the RC-delayed signal TWLF, causing NOR gate 210 to de-assert signal Z9 at time t4 and NFET 212 to turn off at time t5, thereby slowing down the discharge rate of tracking bit-line 220. Signal TWLF asserts at time t5; however, this has no additional effect on the discharge rate of tracking bit-line 220.

After time t4, signals CKP, Z9, TBL, TBLF, and CKPD1 all behave in manners similar to that described above in relation to FIG. 3. The only other difference between FIG. 2 and FIG. 3 occurs when the gate-delayed signal TWLG and the signal TWLF at the far end of tracking word-line 204 return to their initial de-asserted states. In particular, in FIG. 3, the gate-delayed signal TWLG is de-asserted at time t10 and the RC-delayed signal TWLF is de-asserted between time t11 and t12.

Figure 5:
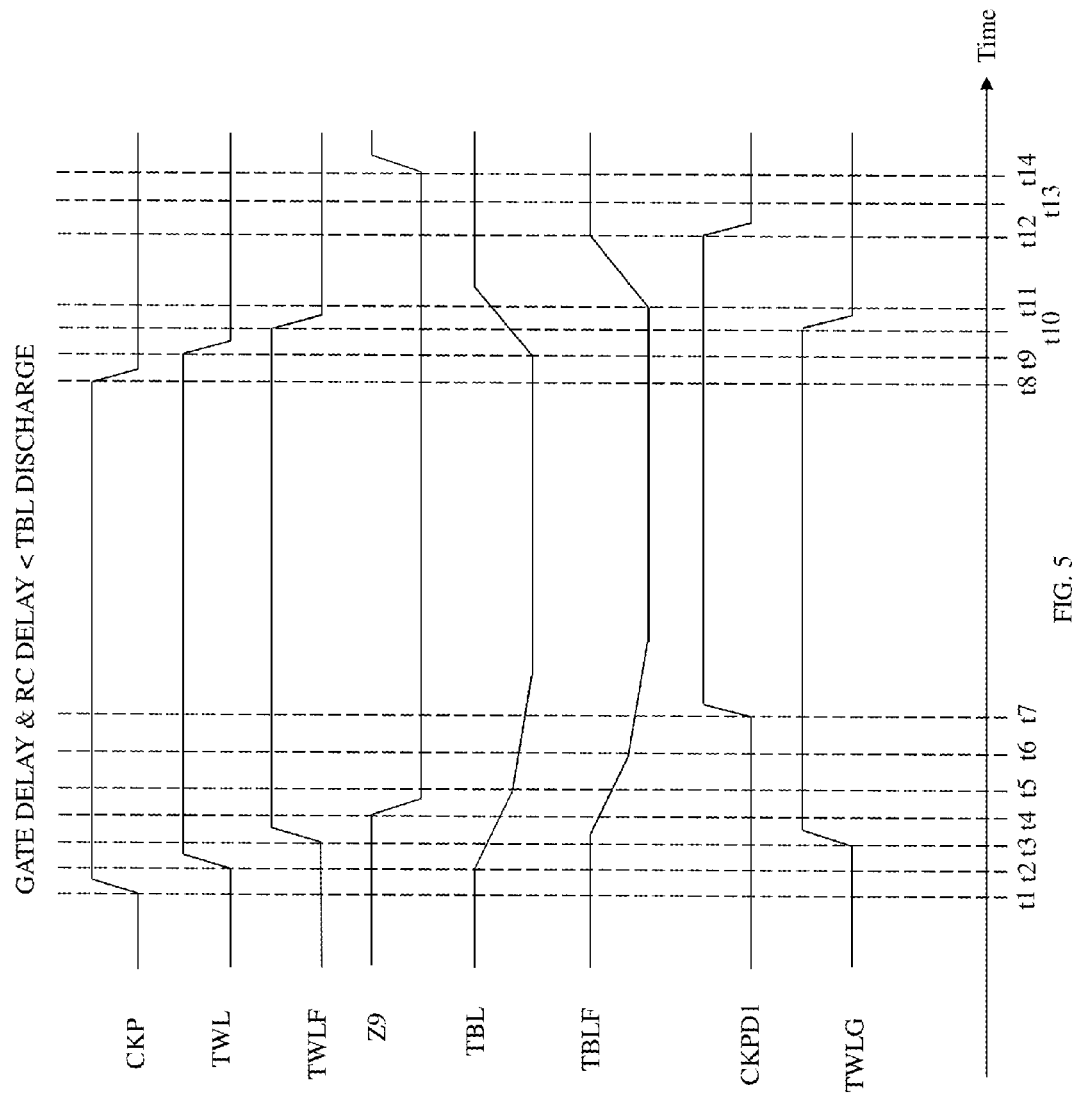
FIG. 5 shows a timing diagram for the bit-line tracking circuit of FIG. 2 for the third scenario when both the tracking-word-line propagation delay and the transistor-based gate delay are shorter than the discharge duration of the tracking bit-line.

FIG. 5 shows a timing diagram for bit-line tracking circuit 112 of FIG. 2 for the third scenario when both the tracking-word-line propagation delay 206 and the transistor-based gate delay are shorter than the discharge duration of tracking bit-line 220. Prior to time t3, bit-line tracking circuit 112 operates in the same manner as it does in the first scenario described above. However, the gate-delayed signal TWLG and the RC-delayed signal TWLF are both asserted at substantially the same time (i.e., at time t3) causing NOR gate 210 to de-assert signal Z9 at time t4 and NFET 212 to turn off at time t5, thereby slowing down the discharge rate of tracking bit-line 220.

After time t4, signals CKP, Z9, TBL, TBLF, and CKPD1 all behave in manners similar to that described above in relation to FIG. 3. The only other difference between FIG. 5 and FIG. 3 occurs when the gate-delayed signal TWLG and the RC-delayed signal TWLF return to their initial de-asserted states. In particular, in FIG. 3, the gate-delayed signal TWLG and the RC-delayed signal TWLF are de-asserted at substantially the same time (i.e., time t10).

Figure 6:
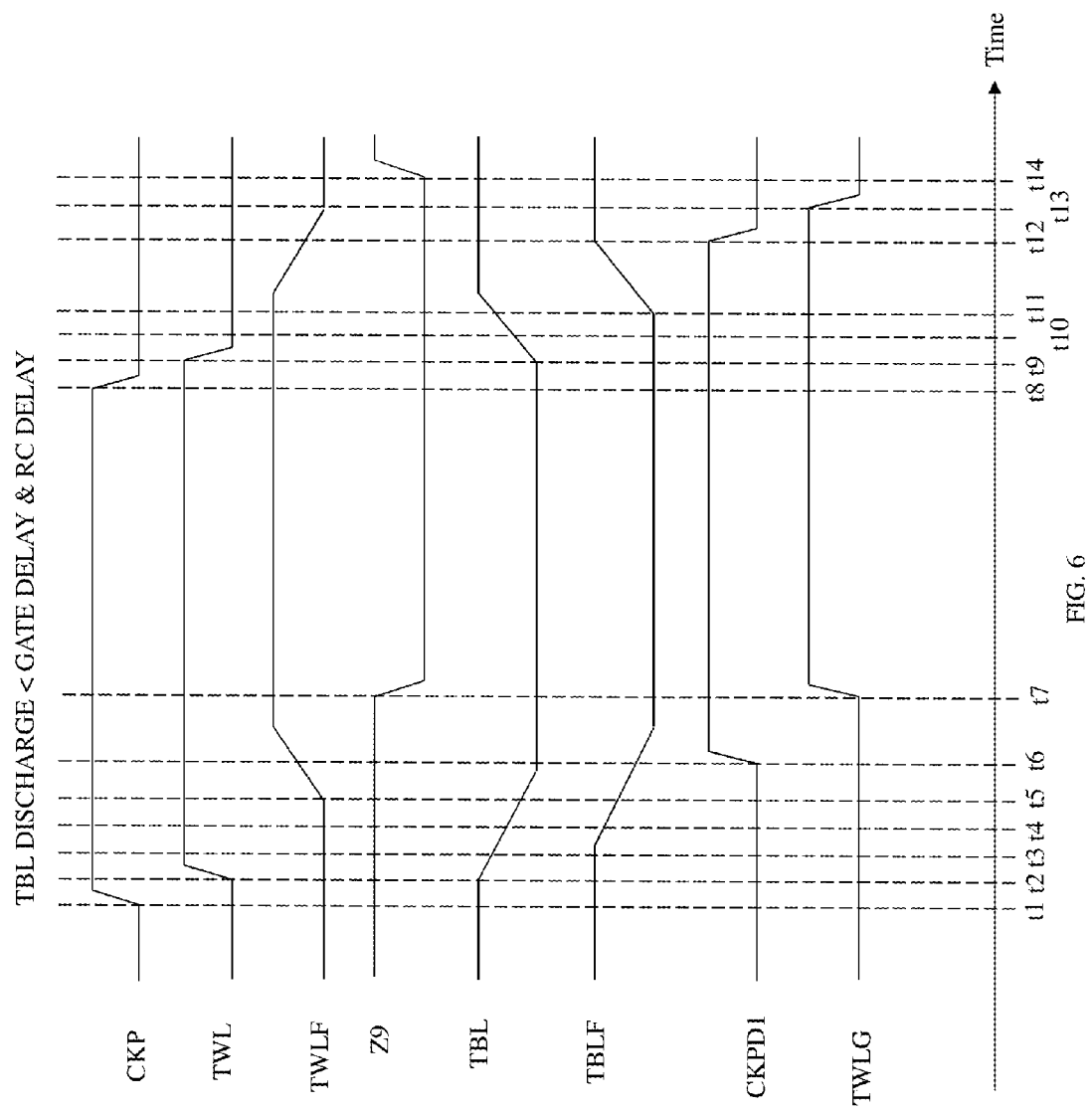
FIG. 6 shows a timing diagram for the bit-line tracking circuit of FIG. 2 for the fourth scenario when both the tracking-word-line propagation delay and the transistor-based gate delay are longer than the discharge duration of the tracking bit-line.

FIG. 6 shows a timing diagram for bit-line tracking circuit 112 of FIG. 2 for the fourth scenario when both the tracking-word-line propagation delay 206 and the transistor-based gate delay are longer than the discharge duration of tracking bit-line 220. Prior to time t3, bit-line tracking circuit 112 operates in the same manner as it does in the first scenario described above. However, at time t3, neither the gate-delayed signal TWLG nor the RC-delayed signal TWLF are asserted. Rather, the RC-delayed signal TWLF is not asserted until time t5 and the gate-delayed signal TWLG is not asserted until time t7.

As a result, NOR gate 210 does not de-assert signal Z9 until time t7 after the signal TBL at the near end of tracking bit-line 220 and the signal TBLF at the far end of tracking bit-line 220 have fully de-asserted. Thus, neither the gate-delayed signal TWLG nor the RC-delayed signal TWLF slow the discharge rate of tracking bit-line 220. Rather, the signal TBL at the near end of tracking bit-line 220 discharges at a constant rate as indicated by the constant slope of the signal TBL between time t2 and time t6, the signal TBLF at the far end of tracking bit-line 220 discharges at a constant rate as indicated by the constant slope of the signal TBLF between time t3 and time t7, and reset signal CKPD1 asserts earlier than in the scenarios described above (i.e., at time t6 as opposed to time t7). After time t7, signals CKP, TWL, TWLF, TWLG, Z9, TBL, TBLF, and CKPD1 are all returned to their initial state prior to time t1.

Figure 7:
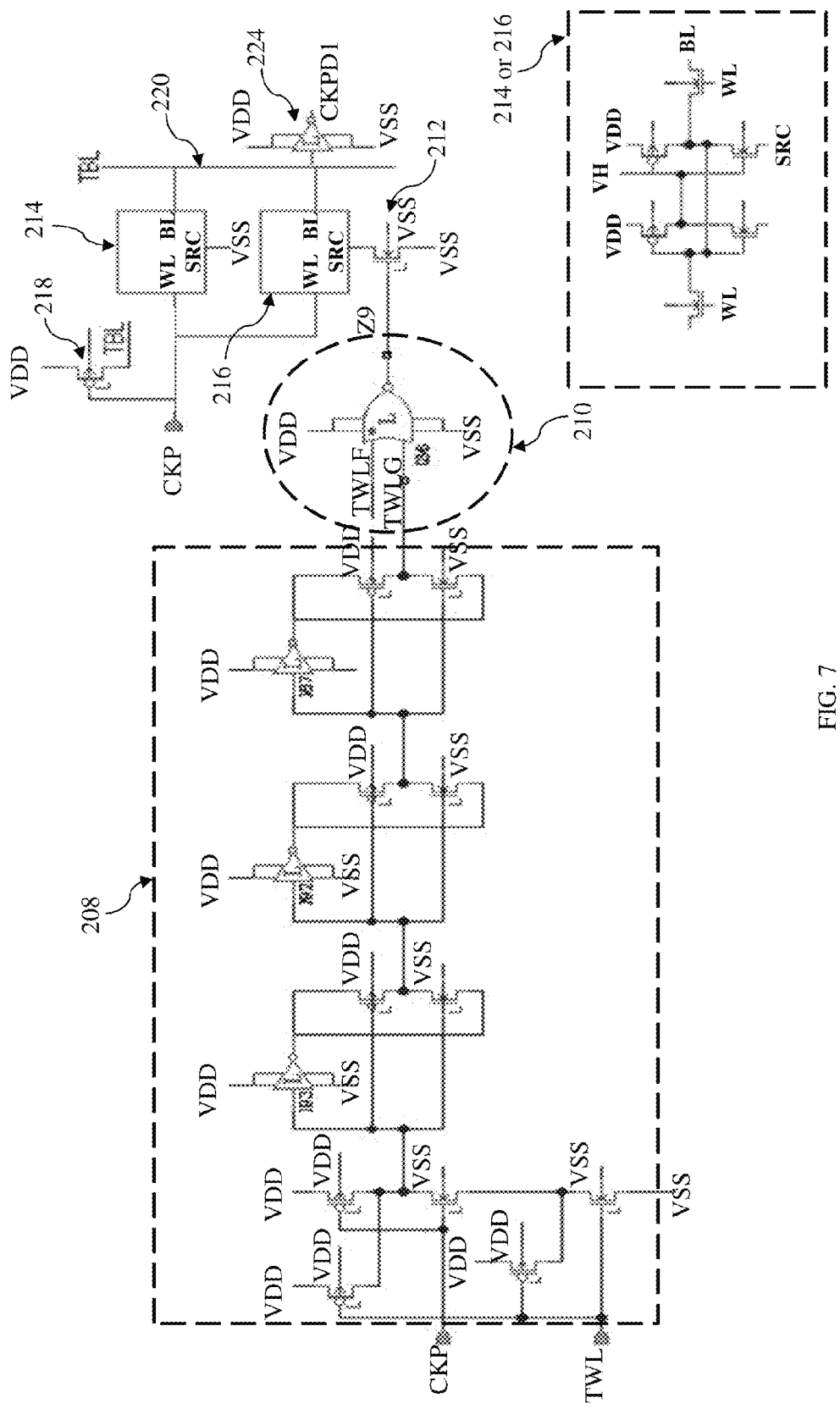
FIG. 7 shows an exemplary circuit implementation of the bit-line tracking circuit of FIG. 2 according to one embodiment of the disclosure.

FIG. 7 shows an exemplary circuit implementation of bit-line tracking circuit 112 of FIGS. 1 and 2 according to one embodiment of the disclosure.

Figure 8:
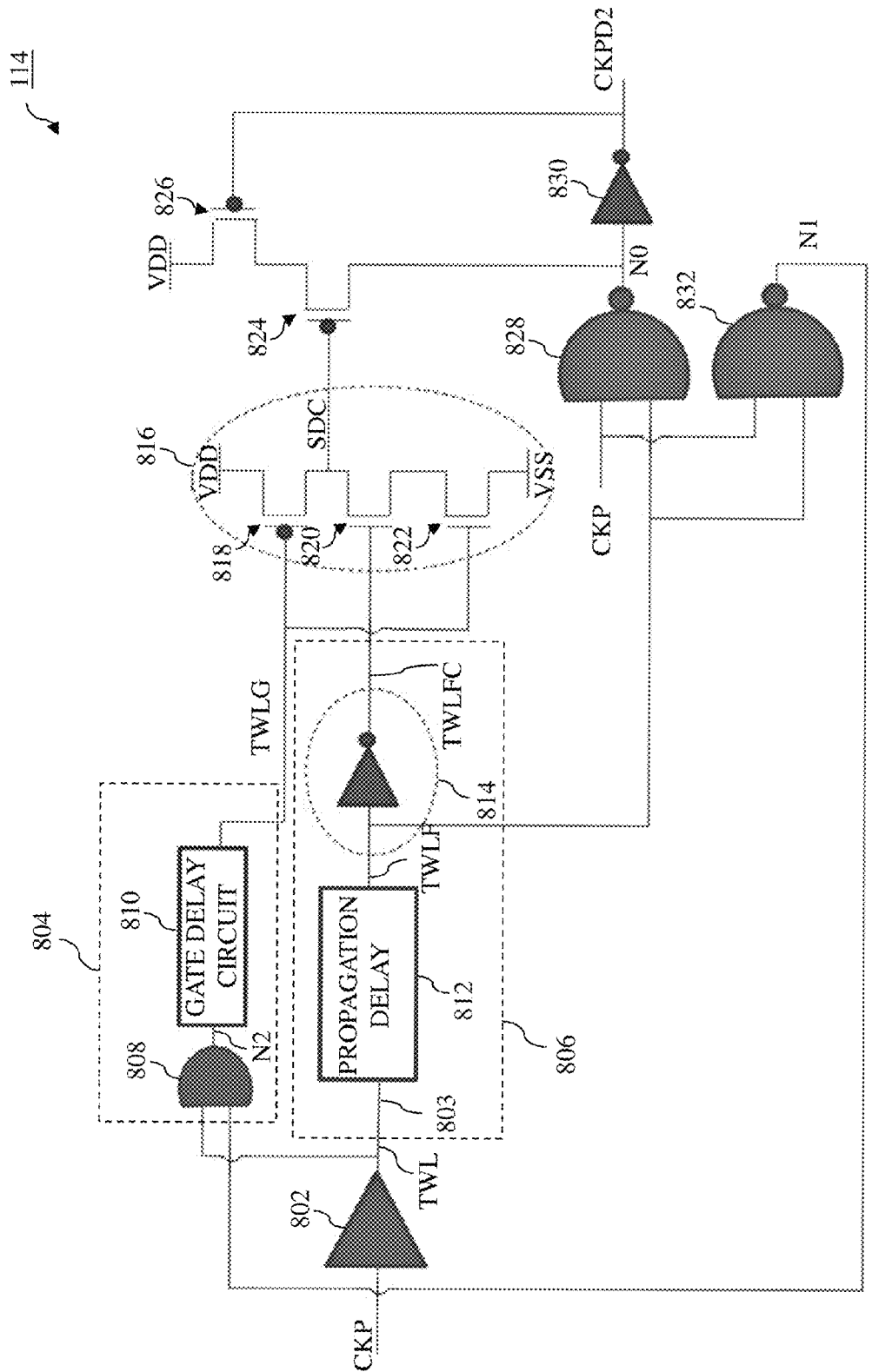
FIG. 8 shows a schematic diagram of the word-line tracking circuit of FIG. 1 according to one embodiment of the disclosure.

FIG. 8 shows a schematic diagram of word-line tracking circuit 114 according to one embodiment of the disclosure. In general, when clock-pulse signal CKP is asserted, a race begins between an upper path 804 corresponding to gate delay (discussed further below) and a lower path 806 corresponding to a propagation delay across a tracking word-line 803 caused by the resistive-capacitive (RC) characteristics of tracking word-line 803. This race determines when word-line tracking circuit 114 will assert reset signal CKPD2 to reset clock-pulse generator 102. Note that tracking word-line 803 may be implemented using the same tracking word-line 204 used in FIG. 2 or may be a different tracking word-line.

When the race begins, one of three scenarios can occur. In the first scenario, upper path 804 is faster than lower path 806, indicating that the gate delay is of less duration than the propagation delay across tracking word-line 803 (i.e., a fast PVT condition). In this first scenario, a slow-down circuit 816 prolongs the amount of time that reset signal CKPD2 is low, thereby extending the write time to the memory cells.

In the second scenario, the speed of upper path 804 is approximately the same as the speed of lower path 806, indicating that the gate delay and propagation delay across tracking word-line 803 are approximately equal. In this second scenario, slow-down circuit 816 again prolongs the amount of time that reset signal CKPD2 is low. However, the slow-down period is of less duration than the slow-down period of the first scenario.

In the third scenario, upper path 804 is slower than lower path 806, indicating that the gate delay is longer than the propagation delay across tracking word-line 803 (i.e., a slow PVT condition). In this third scenario, slow-down circuit 816 does not prolong the amount of time that reset signal CKPD2 is low. As a result, the amount of time that reset signal CKPD2 is low is determined based on the propagation delay across tracking word-line 803. To further understand the operation of word-line tracking circuit 114 in these three scenarios, consider FIGS. 9-11.

Figure 9:
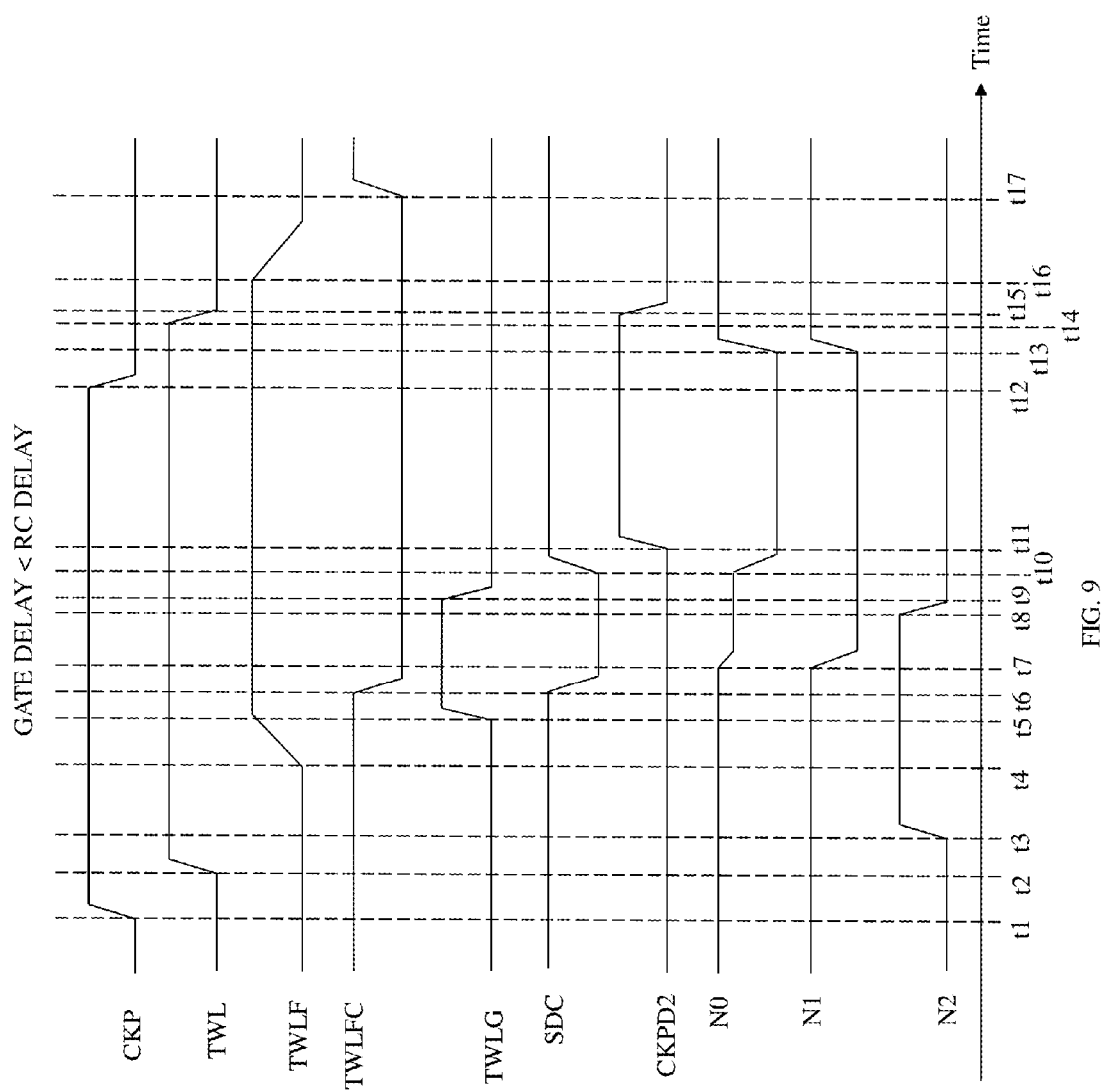
FIG. 9 shows a timing diagram of the word-line tracking circuit of FIG. 8 when the gate delay is of less duration than the propagation delay across the tracking row.

FIG. 9 shows a timing diagram of word-line tracking circuit 114 for the first scenario when the gate delay is of less duration than the propagation delay across tracking word-line 803 (i.e., a fast PVT condition). As shown, the race begins at time t1, when the clock-pulse generator asserts clock-pulse signal CKP. Tracking-row driver 802 drives the near end of tracking word-line 803 based on the asserted clock-pulse signal CKP such that tracking-row driver 802 asserts the signal TWL at the near end of tracking word-line 803 at time t2.

On lower path 806, the signal TWL at the near end of tracking word-line 803 propagates to the far end of tracking word-line 803. After a propagation delay 812 caused by the RC characteristics of tracking word-line 803, the RC-delayed signal TWLF at the far end of tracking word-line 803 is asserted at time t4. Note that propagation delay 812 does not represent a discrete delay element but rather represents the delay properties of tracking word-line 803. The asserted RC-delayed signal TWLF is inverted by inverter 814 to de-assert inverted RC-delayed signal TWLFC at time t6. The de-asserted, inverted RC-delayed signal TWLFC is provided to NFET 820 of slow-down circuit 816.

On upper path 804, after driver 802 asserts the near end of tracking word-line 803 (i.e., time t2) and before time t3, the signal TWL at the upper input of AND gate 808 and the signal N1 at the lower input of AND gate 808 are both asserted. As a result, at time t3, AND gate 808 asserts signal N2, which is provided to tracking-gate circuitry 810 comprising one or more series-connected gate-delay devices (e.g., transistors and/or inverters) that generate an individual or collective transistor-based gate delay. After gate-delay circuitry 810, the gate-delayed signal TWLG signal asserts at time t5 and is provided to PFET 818 and NFET 822 of slow-down circuit 816. Note that, gate-delay circuitry 810 may be implemented together with, or separate from gate-delay circuitry 208 of FIG. 2.

Since, in this first scenario, the gate delay is of less duration than the propagation delay across the tracking row, the gate-delayed signal TWLG is asserted (i.e., at time t5) before the inverted RC-delayed signal TWLFC is de-asserted (i.e., at time t6). As a result, the gate-delayed delayed TWLG signal turns on slow-down circuit 816 causing the assertion of reset signal CKPD2 to be delayed. In particular, at time t5, gate-delayed signal TWLG is asserted such that PFET 818 turns off and NFET 822 turns on, and inverted RC-delayed signal TWLFC is asserted such that NFET 820 is turned on. As a result of this configuration of transistors, slow-down circuit 816 de-asserts the slow-down signal SDC at time t6 (i.e., SDC is pulled downward toward VSS).

At the same time (i.e., t6) that slow-down circuit 816 de-asserts the slow-down signal SDC, signal TWLF at the lower input of NAND gate 828 and CKP at the upper input of NAND gate 828 are both asserted. As a result, NAND gate 828 de-asserts output N0 at time t7. However, the de-assertion of output N0 is restricted by PFET 8824 and PFET 826. In particular, at time t6, when slow-down circuit de-asserts slow-down signal SDC, PFET 824 turns on. Further, at time t6, reset signal CKPD2 is de-asserted such that PFET 826 is turned on. As a result, signal N0 is pulled upward toward VDD. However, the upward pull of VDD is larger than the downward pull of NAND gate 828. Thus, as shown, signal N0 is partially de-asserted between time t7 and time t10. This places word-line tracking circuit 114 into a slow-down state, where inverter 830 is prevented from asserting reset signal CKPD2 (and consequently, the clock-pulse generator is prevented from being reset).

Note that, by the time that the RC-delayed signal TWLFC is de-asserted, indicating that the RC-delayed signal has caught up to the gate-delayed signal, slow-down circuit 816 and PFETs 824 and 826 are inhibiting word-line tracking circuit 114 from asserting CKPD2. Until the gate-delayed signal TWLG is de-asserted, slow-down circuit 816 and PFETs 824 and 826 fight to prevent CKPD2 from being asserted.

The end of the slow-down state is controlled by NAND gate 832 and AND gate 808. In particular, at time t7, the clock-pulse signal CKP at the upper input of NAND gate 832 and the RC-delayed signal TWLF at the lower input of NAND gate 832 are asserted. As a result, NAND gate 832 de-asserts output N1. De-asserting output signal N1 causes AND gate 808, which also receives asserted signal TWL, to de-assert signal N2 at time t8. De-asserting signal N2 causes gate-delayed signal TWLG to de-assert at time t9. De-asserting TWLG causes PFET 818 of slow-down circuit 816 to turn on and NFET 822 of slow-down circuit 816 to turn off. As a result, slow-down circuit asserts slow-down signal SDC at time t10 (i.e., SDC is pulled upward toward VDD), thereby shutting off slow-down circuit 816.

After slow-down circuit 816 is shut off at time t10, reset signal CKPD2 is permitted to be asserted so that the clock-pulse generator may be reset. In particular, once slow-down circuit 816 is shut off, PFET 824 turns off such that NAND gate 828 is not fighting against the upward pull toward VDD. As a result, NAND gate 828 fully de-asserts signal N0 at time t10 and inverter 830 inverts signal N0 to assert the reset signal CKPD2 at time tn.

Between time t11 and time t12, there is a brief delay between the asserting of reset signal CKPD2 and the resetting of the clock-pulse signal CKP. This delay could be due, in part, to a delay by other tracking circuits such as bit-line tracking circuit 112 of FIG. 1 in indicating to the clock-pulse generator that it is okay to reset the clock-pulse signal CKP. Upon being reset, the clock-pulse signal CKP is de-asserted at time t12, placing the memory back into a recess state. From times t12 to t17, signals TWL, TWLF, TWLFC, CKPD2, N0, and N1 in word-line tracking circuit 114 return to their initial state prior to time t1. In particular, the de-asserted clock-pulse signal CKP causes tracking row driver 802 to de-assert signal TWL at time t14, which in turn de-asserts RC-delayed signal TWLF at time t16, which in turn causes inverter 814 to assert inverted RC-delayed signal TWLFC at time t17. Additionally, the de-asserted clock-pulse signal CKP causes NAND gate 828 and NAND gate 832 to assert signals N0 and N1, respectively, at time t13. The assertion of signal N0, then causes inverter 830 to de-assert the reset signal CKPD2 at time t15.

Figure 10:
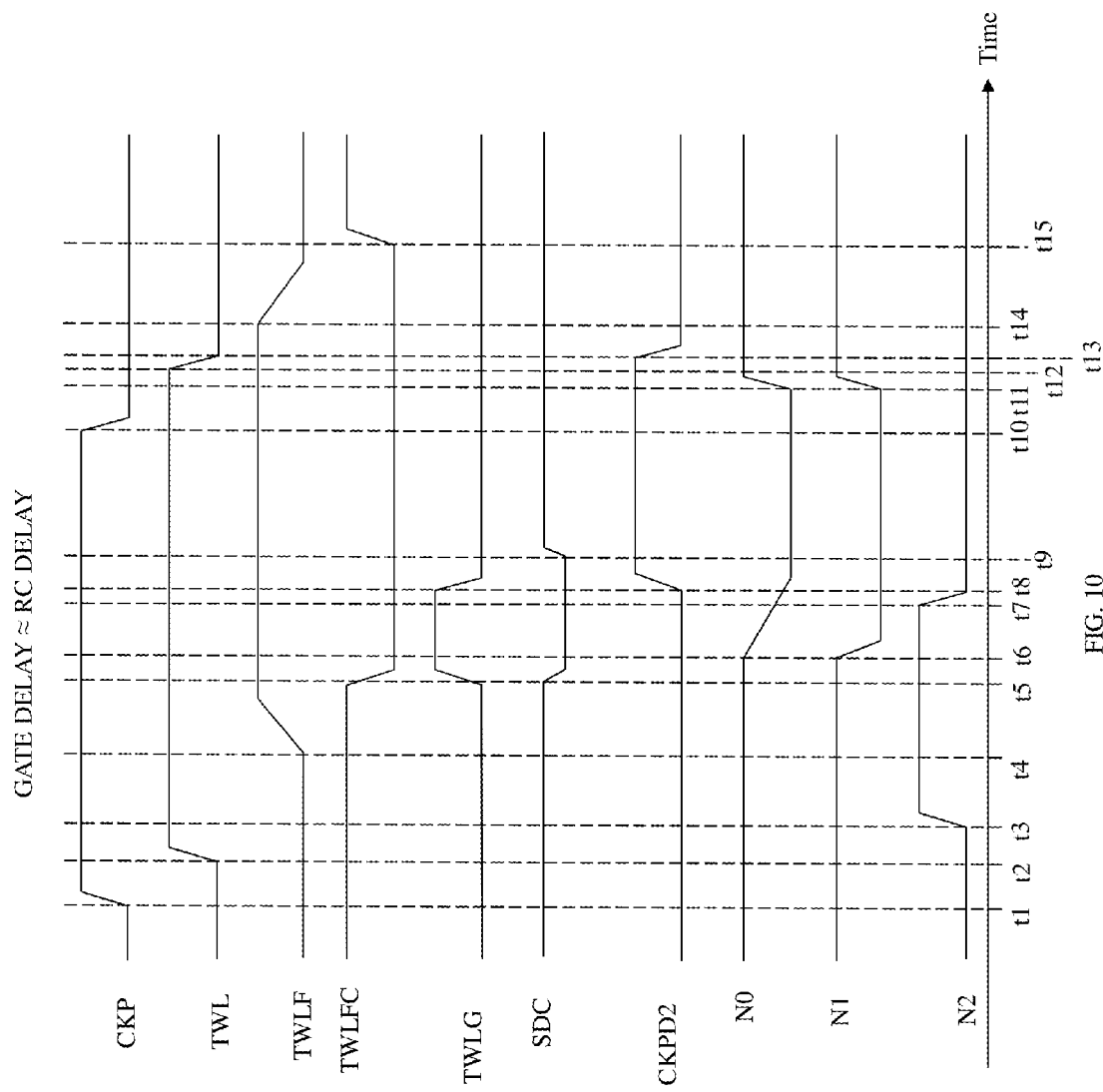
FIG. 10 shows a timing diagram of the word-line tracking circuit of FIG. 8 when the gate delay is substantially equal to the propagation delay across the tracking row.

FIG. 10 shows a schematic diagram of word-line tracking circuit 114 for the second scenario when the gate delay is substantially equal to the propagation delay across tracking word-line 803. Again, as described above, the race between upper path 804 and lower path 806 begins when the clock-pulse generator asserts clock-pulse signal CKP (i.e., at time t1). Prior to time t5, word-line tracking circuit 114 operates in the same manner as it does in the first scenario described above. However, at time t5, the gate-delayed signal TWLG is asserted at substantially the same time that inverter 814 de-asserts the inverted RC-delayed signal TWLFC, indicating that the gate delay is substantially equal to the propagation delay across tracking word-line 803.

The asserted gate-delayed signal TWLG and the de-asserted RC-delay signal TWLFC cause slow-down circuit 816 to de-assert slow-down signal SDC at time t5. However, slow-down signal SDC becomes only partially de-asserted after time t5 (as indicated by the smaller drop of signal SDC in FIG. 10). The partially de-asserted slow-down signal SDC causes the upward pull of VDD through PFET 824 to be less than it would be if slow-down signal SDC were fully de-asserted.

At time t6, the clock-pulse signal CKP at the upper input of NAND gate 828 and the TWLF signal at the lower input of NAND gate 828 are both asserted. As a result, NAND gate 828 attempts to de-assert signal N0. However, the upward pull of VDD slows down the de-assertion of signal N0, such that signal N0 is de-asserted over an extended period of time from time t6 to between time t8 and t9. At time t8, before signal N0 is fully de-asserted, inverter 830 inverts signal N0 to assert the reset signal CKPD2.

Similar to the end of the slow-down state in the first scenario, the shutting off of slow-down circuit 816 is controlled by NAND gate 832 and AND gate 808. In particular, at time t6, the clock-pulse signal CKP at the upper input of NAND gate 832 and the RC-delayed signal TWLF at the lower input of NAND gate 832 are both asserted. As a result, NAND gate 832 de-asserts output N1. De-asserting output signal N1 causes AND gate 808, which also receives asserted signal TWL, to de-assert signal N2 at time t7. De-asserting signal N2 causes gate-delayed signal TWLG to de-assert at time t8. De-asserting TWLG causes slow-down circuit 816 to assert slow-down signal SDC at time t9, thereby shutting off slow-down circuit 816.

After slow-down signal SDC and reset signal CKPD2 are asserted, signals TWL, TWLF, TWLFC, CKPD2, N0, and N1 of word-line tracking circuit 114 are returned, from times t10 to t15, to their initial state prior to time t1 in a manner similar to that described above in relation to times t12 to t17 in the first scenario.

Figure 11:
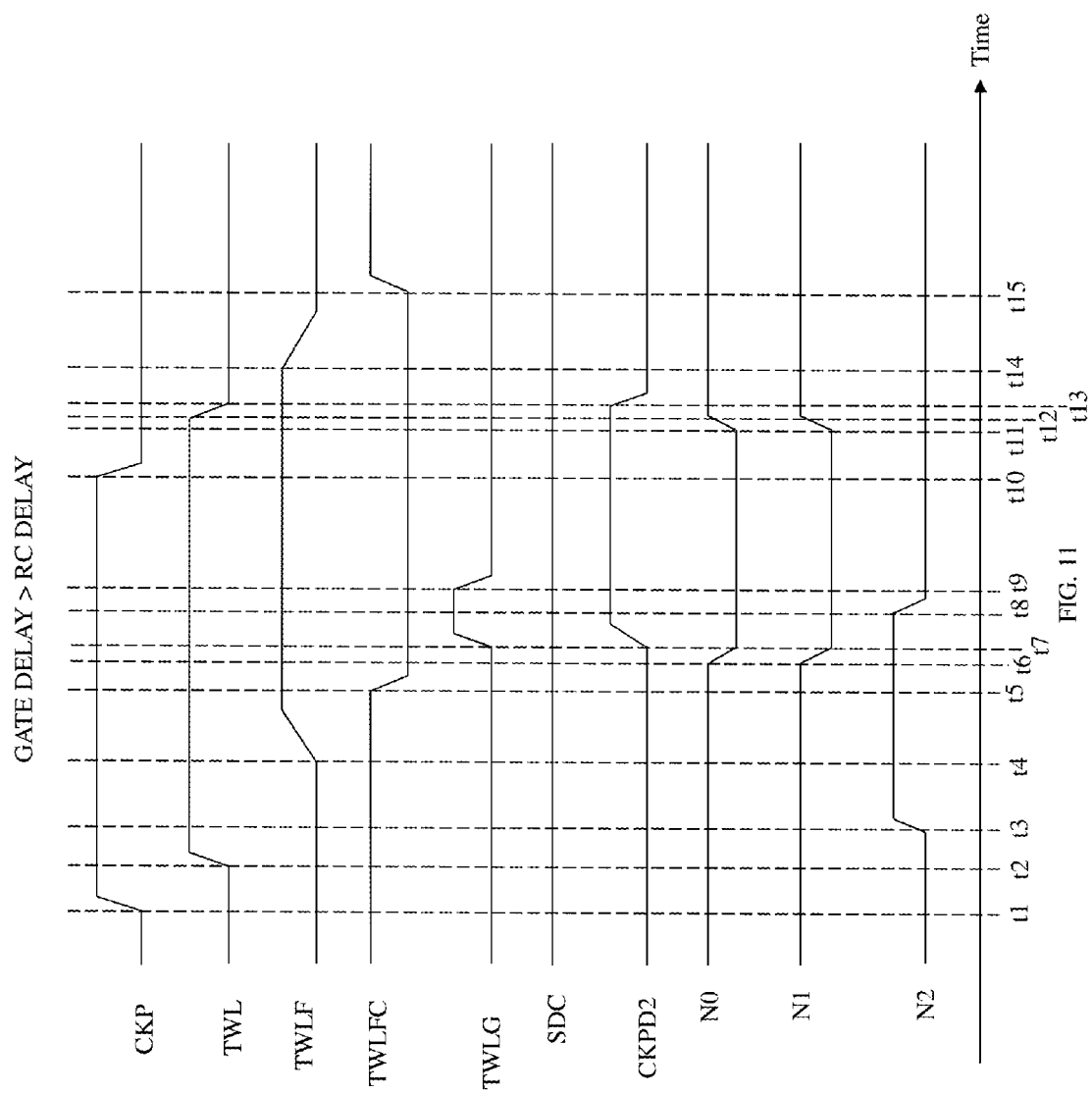
FIG. 11 shows a timing diagram of the word-line tracking circuit of FIG. 8 when the gate delay is longer than the propagation delay across the tracking row.

FIG. 11 shows a schematic diagram of word-line tracking circuit 114 for the third scenario when the gate delay is longer than the propagation delay across tracking word-line 803 (i.e., a slow PVT condition). Yet again, the race between upper path 804 and lower path 806 begins when the clock-pulse generator asserts clock-pulse signal CKP (i.e., at time t1). Prior to time t5, word-line tracking circuit 114 operates in the same manner as it does in the first scenario described above. However, at time t5, inverter 814 de-asserts the inverted RC-delay signal TWLFC, prior to the asserting of the gate-delayed signal TWLG at time t7, indicating that the gate delay is slower than the propagation delay across tracking word-line 803.

Just after time t5, the inverted RC-delay signal TWLFC and the gate-delayed signal TWLG are both de-asserted causing NFET 820 of slow-down circuit 816 to be turned off, PFET 818 of slow-down circuit 816 to remain on, and NFET 822 of slow-down circuit 816 to remain off. As a result, slow-down circuit 816 remains off and the slow-down signal SDC remains asserted (i.e., pulled upward toward VDD).

Since the slow-down signal SDC is asserted, PFET 824 is turned off, and as a result signal, N0 is not pulled upward toward VDD by PFET 824. Further, since signal N0 is not pulled upward by PFET 824, word-line tracking circuit 114 is not inhibited from moving forward (i.e., there is no slow-down). In other words, signal N0 is permitted to be de-asserted without being restricted by an upward pull so that reset signal CKPD2 may be asserted to reset the clock-pulse generator. Thus, in this scenario, the de-assertion of signal N0, and consequently the assertion of CKPD2, is controlled based on the inputs to NAND gate 828, without restriction from slow-down circuit 816.

Just after time t5, clock-pulse signal CKP at the upper input of NAND gate 828 and TWLF at the lower input of NAND gate 828 are both asserted. As a result, NAND gate 828 de-asserts signal N0 at time t6, and inverter 830 inverts signal N0 to assert reset signal CKPD2 at time t7. Note that signal N0 is fully de-asserted in a shorter period of time than in the first and second scenarios. This permits reset signal CKPD2 to be asserted without delay (i.e., without the slowdown). The clock-pulse generator is reset after time t7, and as a result, clock-pulse signal CKP is de-asserted at time t10 returning the memory to a recess state.

At time t7, in addition to the reset signal CKPD2 being asserted, the gate-delayed signal TWLG is also asserted, indicating that the gate-delayed signal TWLG has caught up to the RC-delayed signal TWLFC. However, the output of slow-down circuit 816 remains asserted because NFET 820 is turned off. As a result, there is no pull-down path in the slow-down circuit, and the slow-down signal SDC does not change. Thus, even after the gate-delayed signal TWLG catches up to the RC-delayed signal TWLFC, slow-down circuit 816 does not inhibit word-line tracking circuit 114 from moving forward.

After the clock-pulse signal CKP is de-asserted at time t10, signals TWL, TWLF, TWLFC, CKPD2, N0, and N1 of word-line tracking circuit 114 are returned, from times t10 to t15, to their initial state prior to time t1 in a manner similar to that described above in relation to times t12 to t17 in the first scenario.

Figure 12A:
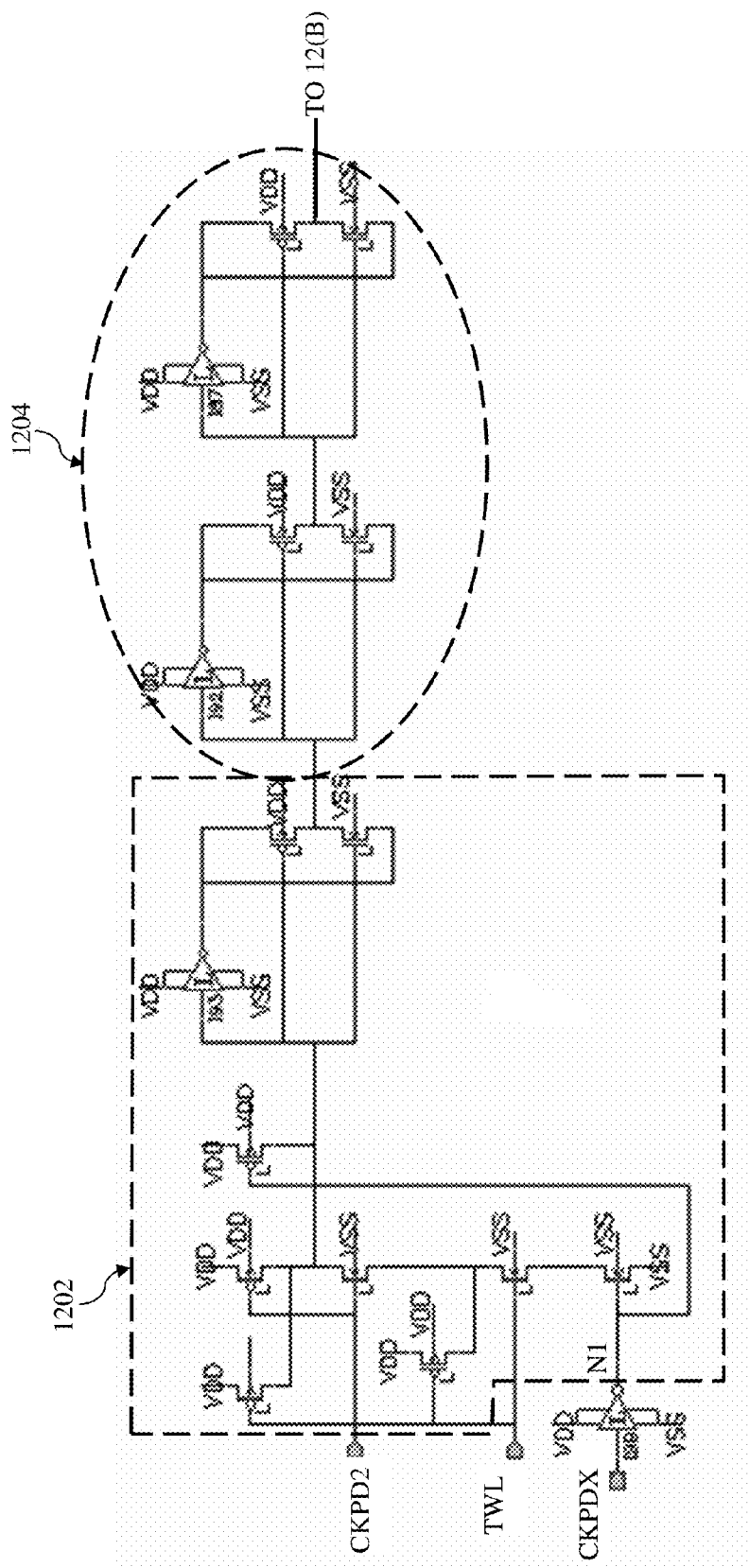
FIGS. 12(A) and 12(B) show an exemplary circuit implementation of the word-line tracking circuit of FIG. 8 according to one embodiment of the disclosure.
Figure 12B:
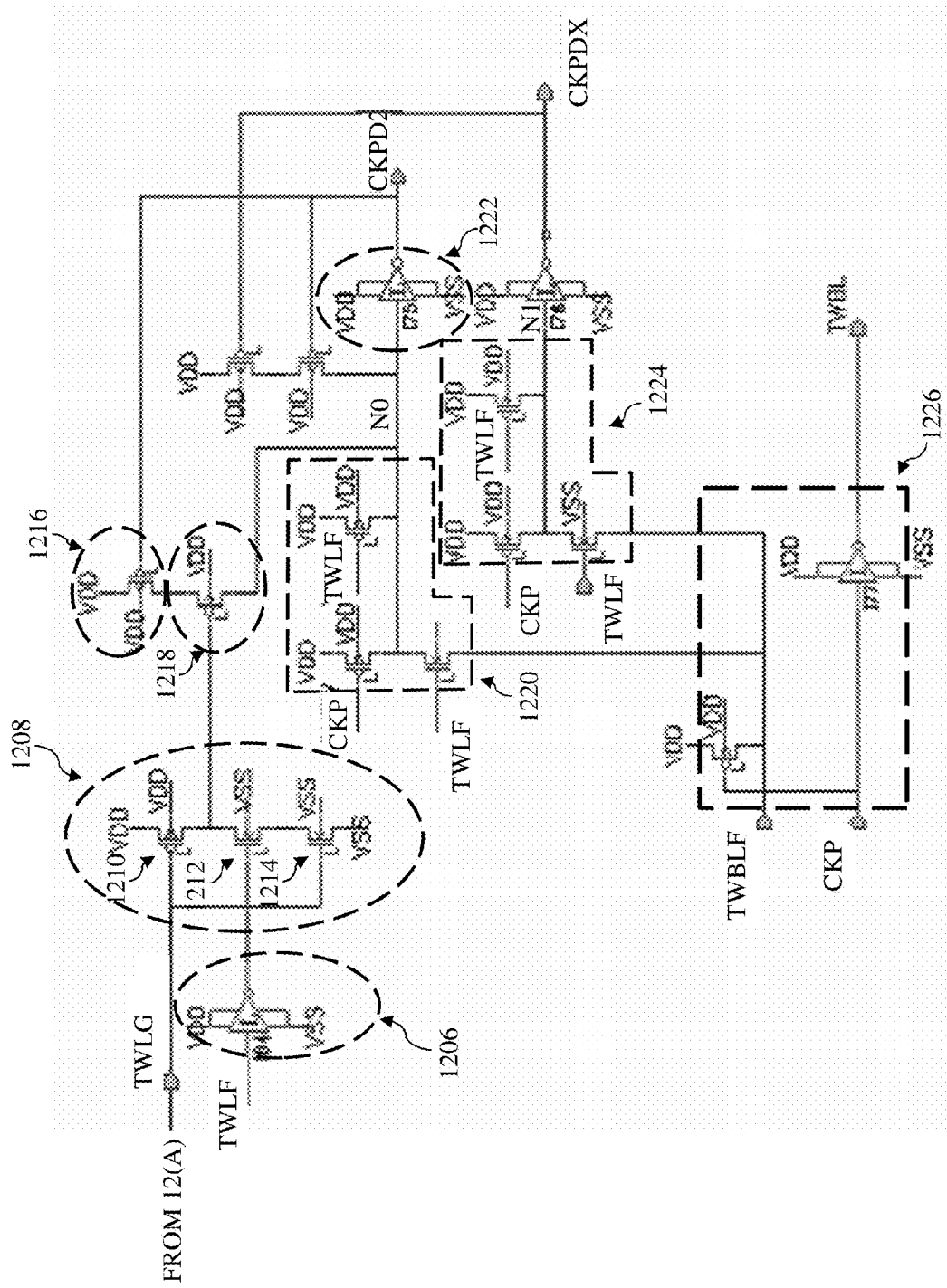

FIGS. 12(A) and 12(B) show an exemplary circuit implementation of word-line tracking circuit 114 of FIG. 8 according to one embodiment of the disclosure. FIG. 12(A) shows an implementation of upper path 804 according to one embodiment, where the components in box 1202 correspond to AND gate 808 of FIG. 8, and the components in box 1204 correspond to transistors used to introduce gate delay 810. Note that one of the transistors in box 1202 receives clock-pulse signal CKP. This transistor is implemented to help the circuit recover quicker after the reset signal CKPD2 is activated.

FIG. 12(B) shows one implementation of the remaining components of word-line tracking circuitry 114 according to one embodiment. In particular, circle 1206 shows an inverter that implements inverter 814. Circle 1208 shows a slow-down circuit that implements slow-down circuit 816, where PFET 1210, NFET 1212, and NFET 1214 correspond to PFET 818, NFET 820, and NFET 822, respectively. Circles 1218 and 1216 show PFETs that implement PFET 824 and PFET 826, respectively. Circle 1222 shows an inverter that implements inverter 830. Boxes 1220 and 1224 implement NAND gates 828 and 832, respectively, along with box 1226, which is shared between boxes 1220 and 1224.

According to various embodiments, tracking circuits of the disclosure balance the competing needs of ensuring reliable reading and/or writing in fast PVT conditions, while at the same time, ensuring sufficient chip speed in slow PVT conditions. For example, bit-line tracking circuit 112 in FIG. 2 and word-line tracking circuit 114 in FIG. 8 extend the clock-pulse duration (i.e., delay the resetting of the clock-pulse generator) in fast PVT conditions to extend the access time thereby ensuring reliable reading and/or writing. However, in slow PVT conditions, bit-line tracking circuit 112 and word-line tracking circuit 114 do not extend the clock-pulse duration (i.e., do not delay the resetting of the clock-pulse generator) and therefore prevent access times from growing unnecessarily long.

In addition, tracking circuits of the disclosure self-adjust for different memory array configurations. For instance, bit-line tracking circuit 112 and word-line tracking circuit 114 adjust access times to account for longer and shorter word lines.

It will be further understood that various changes in the details, materials, and arrangements of the parts which are described and illustrated in order to explain embodiments of the invention may be made by those skilled in the art without departing from the scope of the following claims.

While the exemplary embodiments of the disclosure have been described with respect to processes of circuits, including possible implementation as a single integrated circuit, a multi-chip module, a single card, or a multi-card circuit pack, embodiments of the invention are not so limited. As would be apparent to one skilled in the art, various functions of circuit elements may also be implemented as processing blocks in a software program. Such software may be employed in, for example, a digital signal processor, micro-controller, or general purpose computer.

Embodiments of the invention can take the form of methods and apparatuses for practicing those methods. Embodiments of the invention can also take the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. Embodiments of the invention can also take the form of program code, for example, stored in a non-transitory machine-readable storage medium including being loaded into and/or executed by a machine, wherein, when the program code is loaded into and executed by a machine, such as a computer, the machine becomes an apparatus for practicing an embodiment of the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a memory device comprising:
   a memory array of memory cells arranged in rows and columns;
   a clock-pulse generator configured to generate a clock pulse for controlling access to the memory cells in the memory array; and
   a tracking circuit configured to control a discharge duration of a tracking bit-line of the memory device based on a word-line delay and a gate delay, wherein duration of the clock pulse is controlled based on the controlled discharge duration.

2. The integrated circuit of claim 1, wherein the tracking circuit comprises:
   a first set of one or more discharge cells configured to discharge the tracking bit-line based on the clock pulse; and
   a second set of one or more discharge cells configured to discharge the tracking bit-line based on (i) the clock pulse, (ii) the word-line delay, and (iii) the gate delay.

3. The integrated circuit of claim 2, wherein the tracking circuit further comprises a discharge control circuit comprising:
   a tracking word-line configured to receive a word-line pulse that is generated based on the clock pulse and output a word-line-delayed version of the word-line pulse after the word-line delay; and
   a tracking-gate circuit configured to receive the word-line pulse and output a gate-delayed version of the word-line pulse after the gate delay, wherein the discharge control circuit is configured to slow down a discharge rate of the tracking bit-line when one or more of (i) the word-line delay and (ii) the gate delay is shorter than an uncontrolled discharge duration of the tracking bit-line.

4. The integrated circuit of claim 3, wherein the discharge control circuit comprises a switch configured to disconnect the second set of one or more discharge cells to slow down the discharge rate of the tracking bit-line.

5. The integrated circuit of claim 1, wherein:
   the tracking circuit is adapted to generate a reset signal based on the controlled discharge duration of the tracking bit-line; and
   the clock-pulse generator controls the duration of the clock pulse based on the reset signal.

6. The integrated circuit of claim 1, wherein the tracking circuit is adapted to control the clock-pulse generator to (i) extend the duration of the clock pulse when one or more of (a) the word-line delay and (b) the gate delay is shorter than the uncontrolled discharge duration of the tracking bit-line, and (ii) not extend the duration of the clock pulse when the uncontrolled discharge duration of the tracking bit-line gate delay is shorter than both (a) the word-line delay and (b) the gate delay.

7. The integrated circuit of claim 1, wherein the memory device further comprises a second tracking circuit, the second tracking circuit configured to control duration of a word-line pulse applied to a row of the memory array based on a comparison of the word-line delay and the gate delay.

8. The integrated circuit of claim 7, wherein the second tracking circuit comprises:
   a tracking word-line configured to receive the word-line pulse and output a word-line-delayed version of the word-line pulse;
   a tracking-gate circuitry configured to receive the word-line pulse and output a gate-delayed version of the word-line pulse; and
   a slow-down circuit configured to compare the word-line-delayed and gate-delayed versions of the word-line pulse to control the duration of the word-line pulse.

9. A method for operating a memory device comprising (i) a memory array of memory cells arranged in rows and columns and (ii) a clock-pulse generator configured to generate a clock pulse for controlling access to the memory cells in the memory array, the method comprising:
   (a) controlling a discharge duration of a tracking bit-line based on a word-line delay and a gate delay; and
   (b) controlling a duration of the clock pulse based on the controlled discharge duration of the tracking bit-line.

10. The method of claim 9, wherein step (a) comprises:
    (a1) configuring a first set of one or more discharge cells to discharge the tracking bit-line based on the clock pulse; and
    (a2) configuring a second set of one or more discharge cells to discharge the tracking bit-line based on (i) the clock pulse, (ii) the word-line delay, and (iii) the gate delay.

11. The method of claim 10, wherein step (a2) comprises:
    (a2i) applying a word-line pulse that is generated based on the clock pulse to a tracking word-line to generate a word-line-delayed version of the word-line pulse after the word-line delay; and
    (a2ii) applying the word-line pulse to a tracking-gate circuit to generate a gate-delayed version of the word-line pulse after the gate delay;
    (a2iii) slowing down a discharge rate of the tracking bit-line when one or more of (i) the word-line delay and (ii) the gate delay is shorter than an uncontrolled discharge duration of the tracking bit-line.

12. The method of claim 11, wherein step (a2iii) comprises disconnecting the second set of one or more discharge cells to slow down the discharge rate of the tracking bit-line.

13. The method of claim 9, wherein:
    step (a) comprises generating a reset signal based on the controlled discharge duration of the tracking bit-line; and
    step (b) comprises controlling the duration of the clock pulse based on the reset signal.

14. The method of claim 9, wherein step (b) comprises:
    (1) extending the duration of the clock pulse when one or more of (i) the word-line delay and (ii) the gate delay is shorter than the uncontrolled discharge duration of the tracking bit-line, and
    (2) not extending the duration of the clock pulse when the uncontrolled discharge duration of the tracking bit-line gate delay is shorter than both (i) the word-line delay and (ii) the gate delay.

15. The method of claim 9, further comprising (c) controlling duration of a word-line pulse applied to a row of the memory array based on a comparison of the word-line delay and the gate delay.

16. The method of claim 15, wherein step (c) comprises:
    applying the word-line pulse to a tracking word-line to generate a word-line-delayed version of the word-line pulse;
    applying the word-line pulse to a tracking-gate circuitry to generate a gate-delayed version of the word-line pulse; and
    comparing the word-line-delayed and gate-delayed versions of the word-line pulse to control the duration of the word-line pulse.

* * * * *